US007084655B2

(12) United States Patent
Min et al.

(10) Patent No.: US 7,084,655 B2
(45) Date of Patent: Aug. 1, 2006

(54) BURN-IN TEST APPARATUS FOR BGA PACKAGES USING FORCED HEAT EXHAUST

(75) Inventors: Byung-Jun Min, Chungcheongnam-do (KR); Woo-Jin Kim, Gyeonggi-do (KR); Jeong-Ho Bang, Gyeonggi-do (KR); Hyun-Seop Shim, Incheon-si (KR); Hyun-Geun Iy, Chungcheongnam-do (KR); Jae-Il Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/025,092

(22) Filed: Dec. 28, 2004

(65) Prior Publication Data
US 2005/0179457 A1 Aug. 18, 2005

(30) Foreign Application Priority Data
Feb. 17, 2004 (KR) ...................... 10-2004-0010375

(51) Int. Cl.
*G01R 31/02* (2006.01)
(52) U.S. Cl. ...................................... 324/760
(58) Field of Classification Search ................ 324/760, 324/765, 158.1, 754; 165/80.3–80.5; 438/14–18; 361/679, 688–690
See application file for complete search history.

(56) References Cited
U.S. PATENT DOCUMENTS
5,851,143 A * 12/1998 Hamid ........................ 454/57

6,353,329 B1 * 3/2002 Kiffe .......................... 324/760
6,861,861 B1 * 3/2005 Song et al. .................. 324/760

FOREIGN PATENT DOCUMENTS
| JP | 59-057463 | 4/1984 |
| JP | 63-005282 | 1/1988 |
| JP | 2001-004693 | 1/2001 |
| KR | 1999-013983 | 4/1999 |

OTHER PUBLICATIONS
English language abstract of Korean Publication No. 1999-013983.
English language abstract of Japanese Publication No. 2001-004693.
English language abstract of Japanese Publication No. 59-057463.
English language abstract of Japanese Publication No. 63-005282.

* cited by examiner

*Primary Examiner*—Jermele Rollington
*Assistant Examiner*—Tung X. Nguyen
(74) *Attorney, Agent, or Firm*—Marger Johnson & McCollom, P.C.

(57) ABSTRACT

A forced air heat exhaust type of burn-in test apparatus for packages: A first air supply duct provides air to the burn-in chamber and a second air supply duct provides air to supply tubes that direst air into the test sockets that hold the packages. The test sockets have a structure that allows air ventilation of the conductive balls. Accordingly, the apparatus can control the temperature around the packages as well as the temperature in the burn-in chamber, thus preventing conductive ball-melting.

16 Claims, 10 Drawing Sheets

BURN-IN TEST APPARATUS FOR BGA PACKAGES USING FORCED HEAT EXHAUST

CROSS REFERENCE TO RELATED APPLICATIONS

This U.S. non-provisional application claims priority under 35 U.S.C. §119 to Korean Patent Application No. 2004-10375 filed Feb. 17, 2004. The entire content of Korean Patent Application No. 2004-10375 is hereby incorporated herein by reference.

BACKGROUND OF THE INVENTION

1. Field of the Invention

The present invention relates to a test apparatus used for semiconductor chip packages and, more particularly, to a burn-in test apparatus used for ball grid array (BGA) packages.

2. Description of the Related Art

Semiconductor chip packages containing integrated circuit chips may have defects which appear some time after fabrication or assembly. Many such defective packages break down within approximately one thousand hours after use. For this reason, semiconductor chip packages are often subjected to a burn-in test before sale. In the burn-in test, the packages undergo extreme electrical and thermal stress for a period of time at an elevated temperature. For example, the burn-in test for some packages utilizes a temperature of about 80 to 125° C. in order to apply thermal stress to the packages.

Recently, the use of Ball Grid Array (BGA) packages has increased. For BGA packages, the burn-in test often requires an ultrahigh temperature of about 125° C. or more in order to guarantee the ultimate reliability of the products.

FIG. 1 shows, in a cross-sectional view, a prior art burn-in test apparatus 300 used for the BGA packages. A test socket 310 of the prior art burn-in test apparatus is shown in FIG. 1. FIGS. 2 and 3 show, a side view and a sectional view, respectively, of test socket 310.

The burn-in test apparatus 300 is a known type of burn-in tester (MBT) that creates the required temperature conditions by using heated air. The apparatus 300 includes a burn-in chamber 350, a heating unit 370, an air supply duct 380, and an exhaust duct 410.

The burn-in chamber 350 provides a space where suitable test operations can be performed on BGA packages 310. The burn-in chamber 350 has a temperature sensor 355 to measure the internal temperature of the chamber 350. The BGA packages 310 are held in test sockets 310 that are positioned on the burn-in board 330. A number of burn-in boards 330 are positioned in a rack 345. The rack 345 has guide rails 346 that allow easy loading and unloading of the burn-in boards 330. The rack 345 also establishes connections between the packages 310 and a test system unit (not shown).

As shown in FIGS. 2 and 3, the test socket 310 is composed of a socket body 311, a plurality of contact pins 313, a holder 315, and a cover 321. The BGA package 10 is inserted into the socket body 311 and fixed in position by the holder 315. The holder 315 is moved into position by operation of the cover 321. A male guide 323 extends downward from one side of the cover 321. The guide 323 moves up and down in a female guide 316 that is recessed in one side of the socket body 311. The cover 321 is opened and shut in a vertical direction. The solder balls 15 that are located on the bottom face of the BGA package 10 are electrically coupled to the contact pins 313 that are located in the socket body 311.

The heating unit 370 is positioned above the burn-in chamber 350 and it heats the air. The heating unit 370 includes a heater 371, and an air blower 373. The blower 373 produces a current of heated air from the heating unit 370 to the air supply duct 380. The heating unit 370 has at least one air intake 375 through which non-heated air flows from the outside into the heating unit 370.

The air supply duct 380 is positioned at one side of the burn-in chamber 350 and provides a passage through which heated air flows from the heating unit 370 into the burn-in chamber 350. The exhaust duct 410 is positioned at the other side of the burn-in chamber 350 and provides a passage through which heated air flows from the burn-in chamber 350 to the outside. The exhaust duct 410 has an exhaust port 415 to allow heated air to flow to the outside. A perforated plate 381 with holes 383 is located at the interface between the burn-in chamber 350 and the air supply duct 380. Similarly, another perforated plate 411 with holes 413 is located at the interface between the burn-in chamber 350 and the exhaust duct 410.

At the beginning of the burn-in test, the heater 371 heats air supplied from the outside through the air intake 375. The air blower 373 supplies heated air to the burn-in chamber 350 through the air supply duct 380 and the perforated plate 381. When the temperature measured by the sensor 355 reaches a given value, the heater 371 stops heating. If the temperature inside the chamber 350 exceeds a given value, air inside the chamber 350 is exhausted to the outside through the exhaust duct 410. On the other hand, if the temperature is below a given value, the heater 371 is again operated.

The above-discussed conventional burn-in test apparatus 300 has the following drawbacks. When the burn-in chamber 350 is crowded, the space between the adjacent upper and lower burn-in boards 330 is so narrow that heated air cannot flow easily. It is therefore difficult to reliably control the temperature of the BGA package 10 contained in each test socket 310. Also, the BGA package 10 generates heat during burn-in tests, and such heat may stay in the narrow space between the burn-in boards 330 and not be quickly exhausted.

The air flow may be hampered by the structure of the test socket 310. There is no space that permits significant air flow between the solder balls 15 and the contact pins 313. Thus, the temperature inside the test socket 310 may exceed the melting point of solder, and this may lead to melting of the solder balls 15. This may become a serious issue for advanced, highly-integrated and smaller packages. In addition, the ball-melting problem may give rise to problems with the test socket 310, increasing repair expenses and lowering productivity. The ball-melting problem may become a bottleneck in the development of new products.

SUMMARY OF THE INVENTION

The present invention provides an improved burn-in test apparatus for ball grid array (BGA) packages. The burn-in test apparatus includes a test chamber with a plurality of test sockets located on burn-in boards. The test sockets are configured to allow air ventilation. Air supply tubes direct air toward the test sockets. A first air supply duct directs heated air from a heating unit to the chamber. A second air supply duct provides heated air from the heating unit to the air supply tubes.

Each test sockets includes a socket body that has a central recess area for accommodating a BGA package. Each test socket also has a plurality of contact pins that protrude from the socket body and contact the solder balls of the BGA package. This allows air circulation near the solder balls. The test sockets may include openings to permit air ventilation. Additionally the guides which hold the BGA package in place may have a recessed central part with a ventilation opening.

DETAILED DESCRIPTION OF THE PREFERRED EMBODIMENTS

Figure 1:
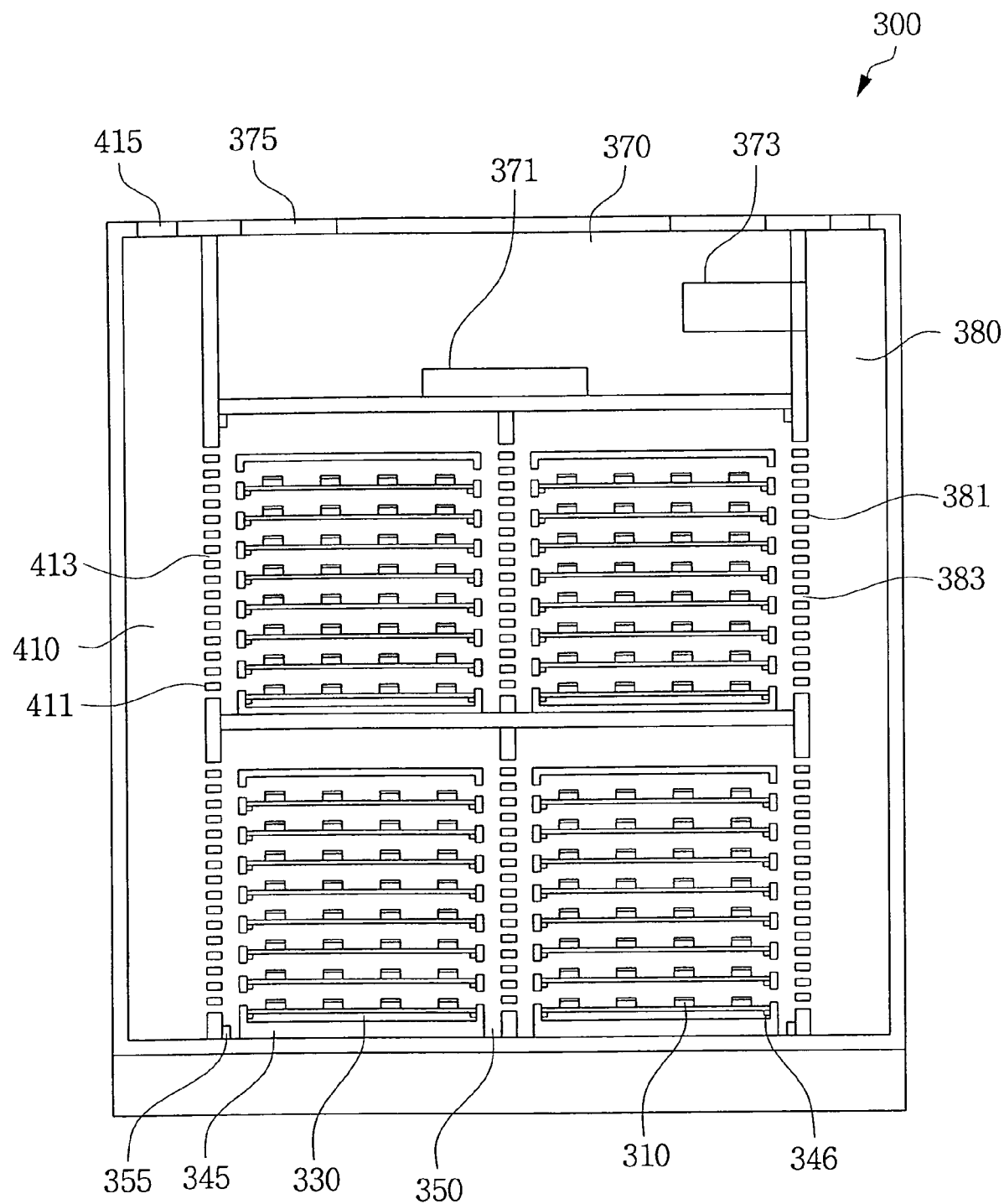
FIG. 1 is a cross-sectional view of a prior art burn-in test apparatus.
Figure 2:
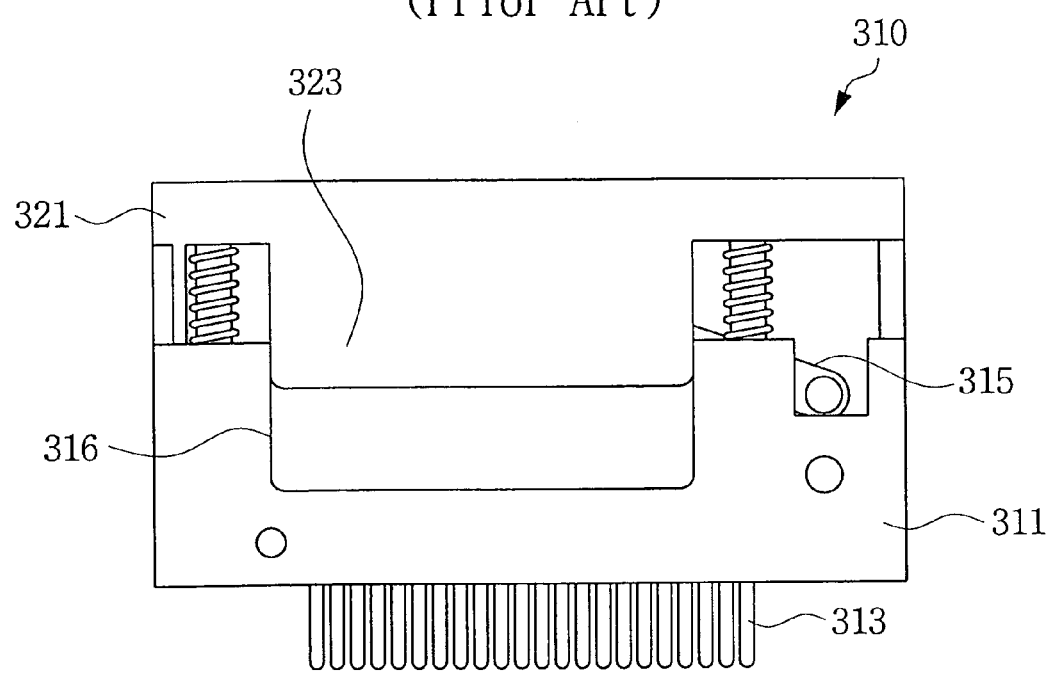
FIG. 2 is a side view of the prior art test socket shown in FIG. 1.
Figure 3:
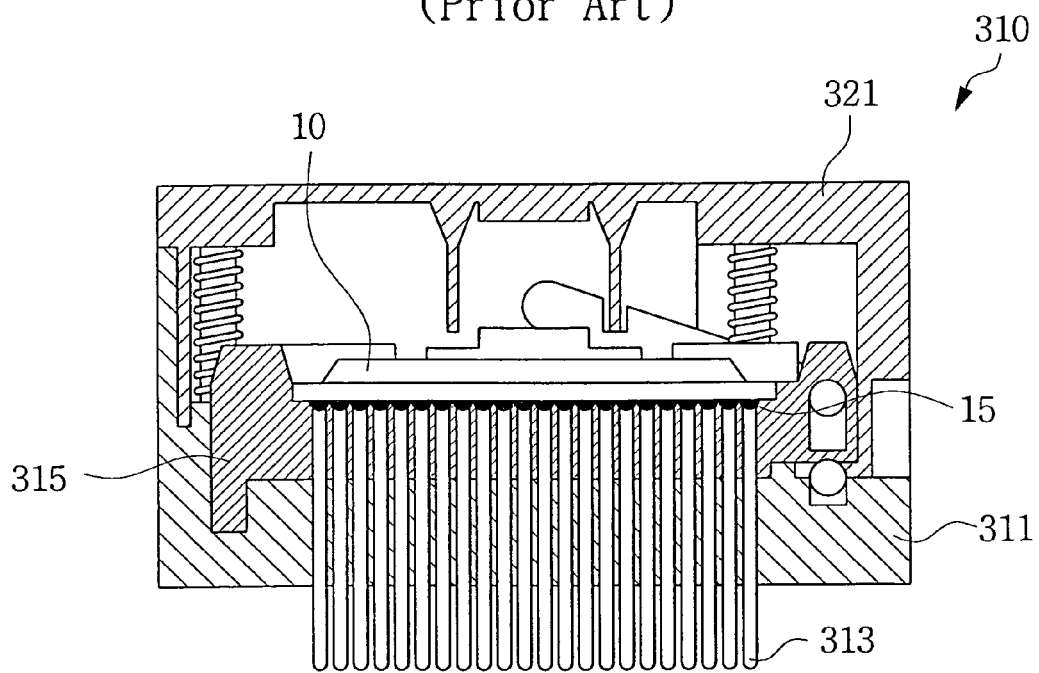
FIG. 3 is a cross-sectional view of the prior art test socket shown in FIG. 2.

Exemplary, non-limiting embodiments of the present invention will now be described with reference to the accompanying drawings. This invention may, however, be embodied in many different forms and the scope of this invention should not be construed as limited to the exemplary embodiments set forth herein. Rather, the disclosed embodiments are provided so that this disclosure will convey the scope of the invention to those skilled in the art. The principles and feature of this invention may be employed in varied and numerous embodiments without departing from the spirit and scope of the invention.

In the description, well-known structures and processes have not been described or illustrated in detail. It should be understood that the figures are not drawn to scale. Rather, for simplicity and clarity of illustration, the dimensions of some of the elements are exaggerated relative to other elements. Like reference numerals and characters are used for like and corresponding parts of the various drawings.

Exemplary Preferred Embodiment

Figure 4:
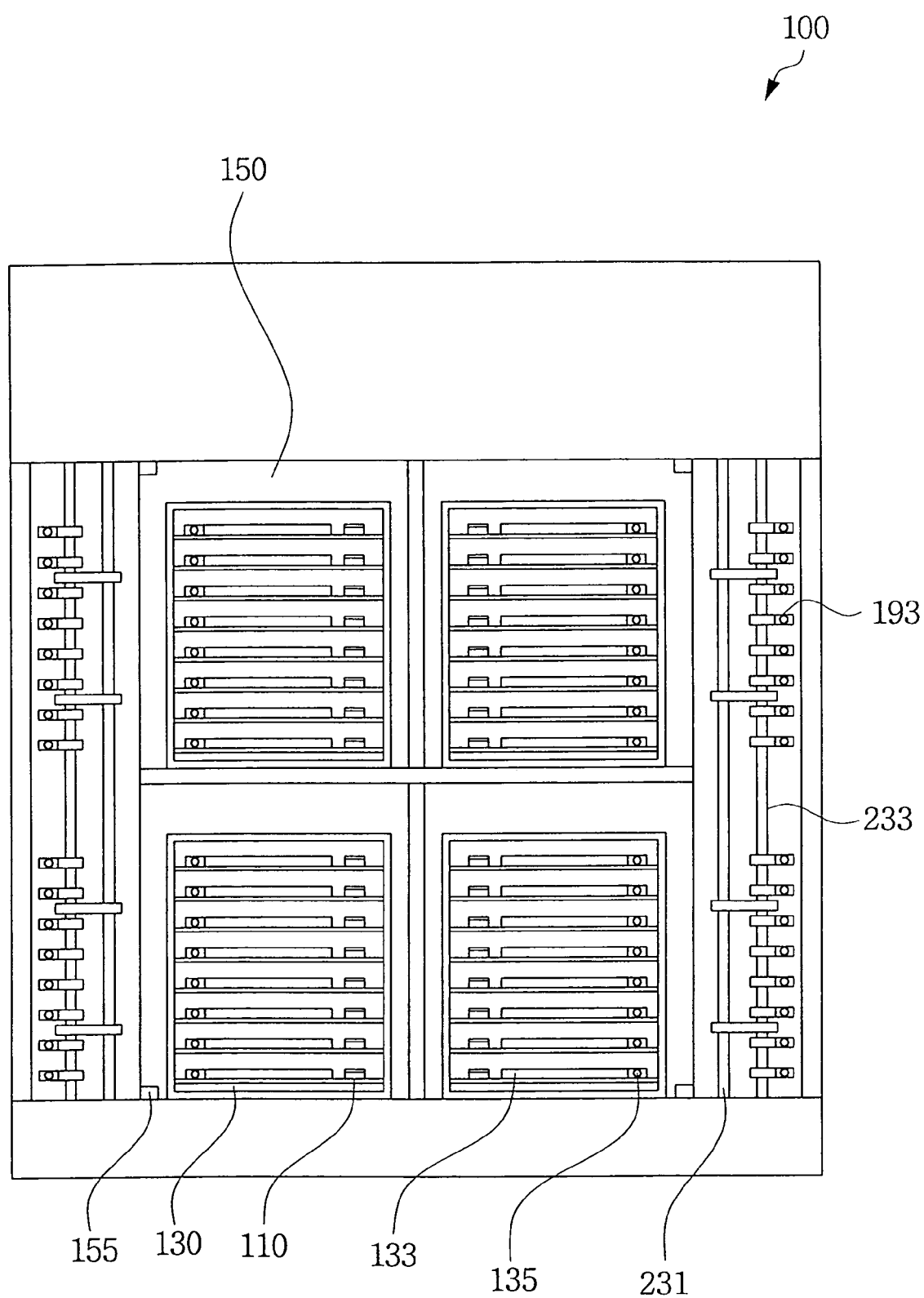
FIG. 4 is a front view of a burn-in test apparatus in accordance with an exemplary preferred embodiment of the present invention.
Figure 5:
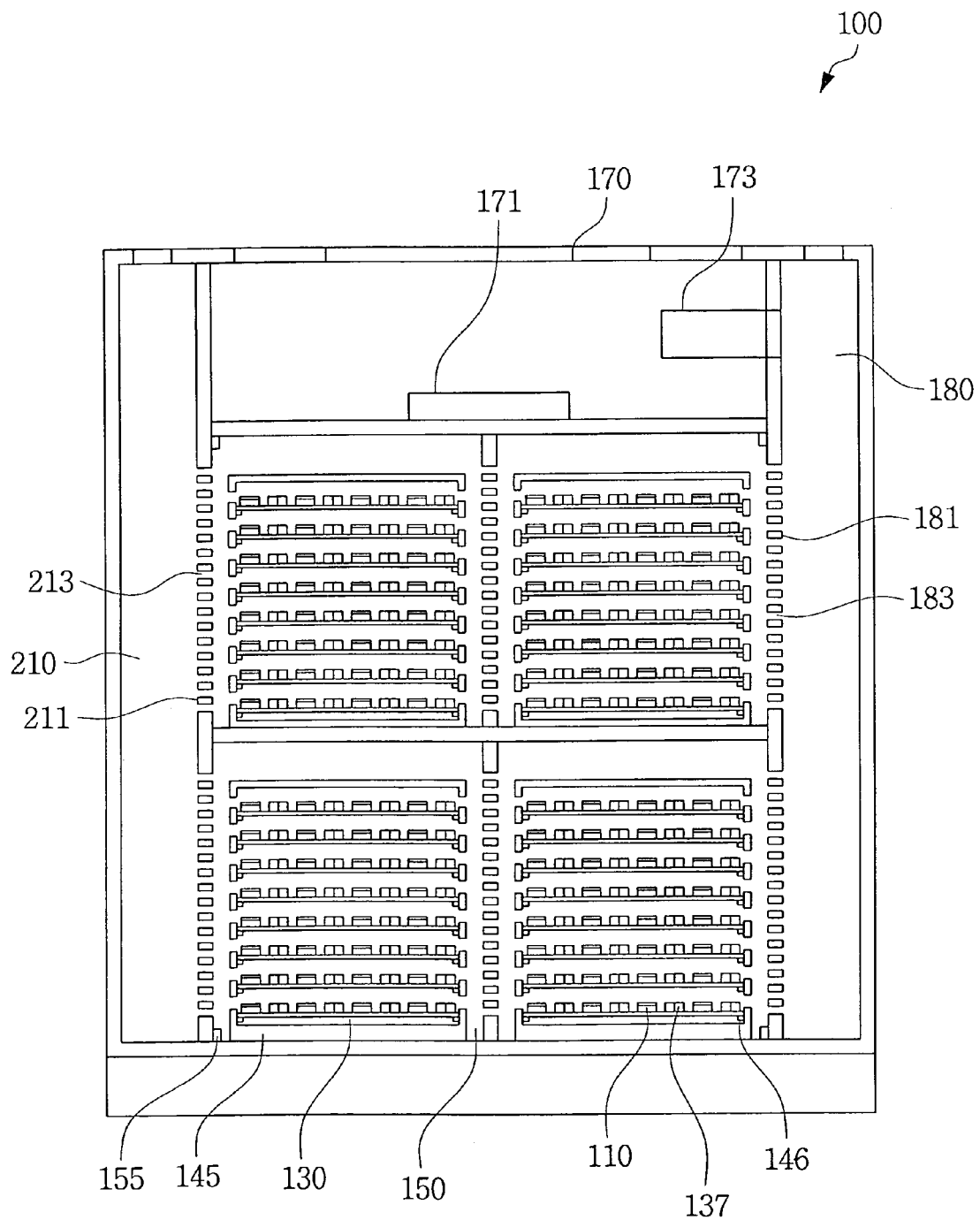
FIG. 5 is a vertically cross-sectional view of the burn-in test apparatus of the exemplary preferred embodiment shown in FIG. 4.

FIGS. 4 and 5 are a front view and a vertically cross-sectional view of a burn-in test apparatus 100 in accordance with an exemplary preferred embodiment of the present invention. Furthermore, FIG. 6 is a horizontally cross-sectional view of an upper part of the burn-in test apparatus 100 shown in FIGS. 4 and 5.

Figure 6:
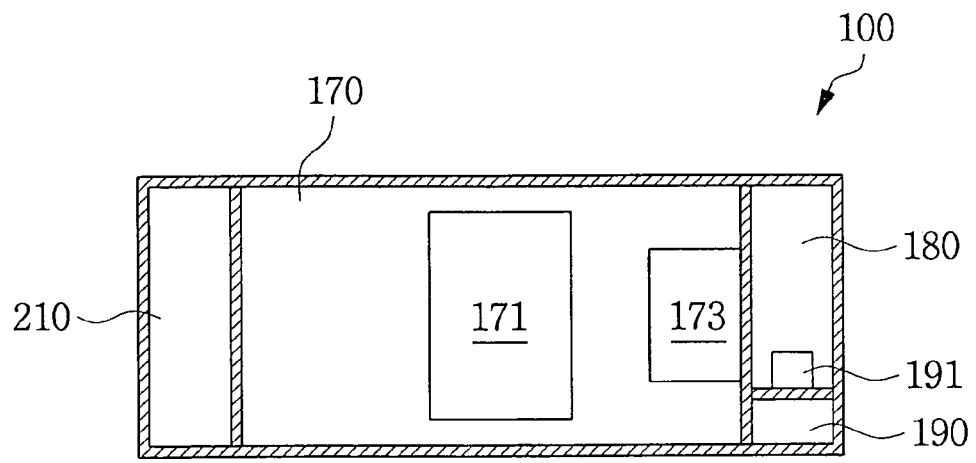
FIG. 6 is a horizontally cross-sectional view of an upper part of the burn-in test apparatus shown in FIGS. 4 and 5.

Referring to FIGS. 4 to 6, the burn-in test apparatus 100 includes a plurality of test sockets 110, each of which accommodates a BGA package and is configured to allow ventilation of air. The burn-in test apparatus 100 further includes a plurality of burn-in boards 130, each of which has several test sockets 110 assembled thereon. The boards 130 also have an air supply tube 133 for blowing air toward the test sockets 110. Additionally, the burn-in test apparatus 100 has a burn-in chamber 150 in which the burn-in boards 130 are loaded and an appropriate test environment is provided. The burn-in test apparatus 100 has a heating unit 170 that heats air, a first air supply duct 180 that provides heated air from the heating unit 170 into the burn-in chamber 150, a second air supply duct 190 that provides heated air from the heating unit 170 into the air supply tube 133 of the burn-in board 130, and an exhaust duct 210 that exhausts heated air from the burn-in chamber 150.

Figure 7:
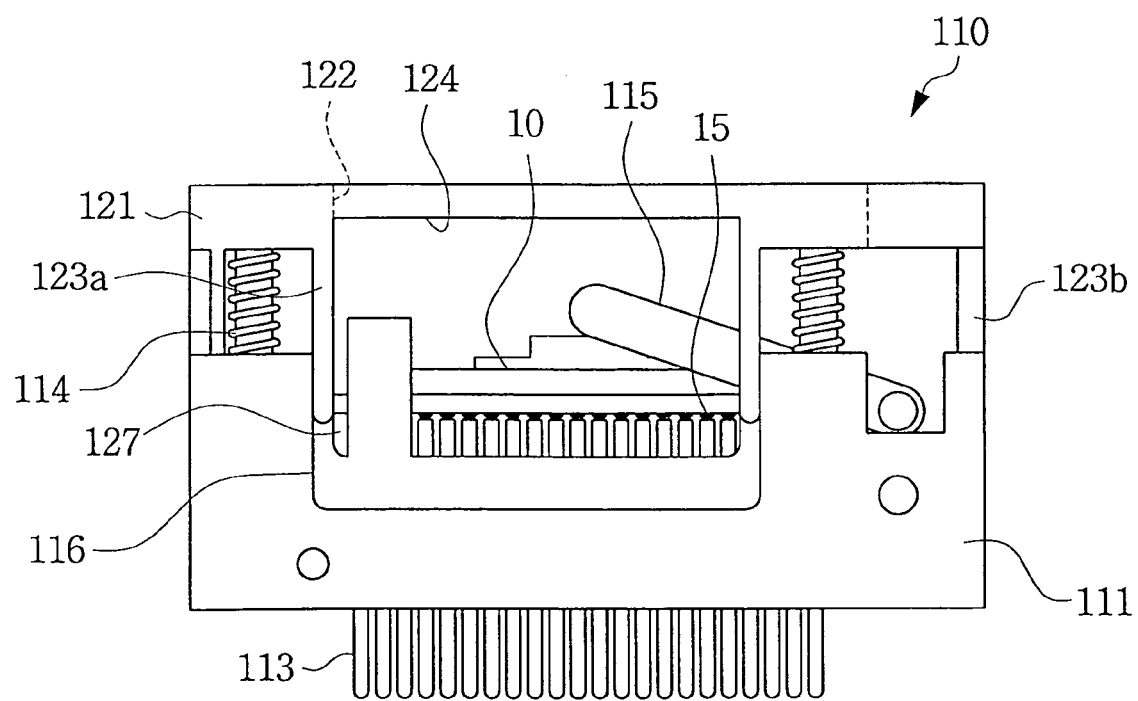
FIG. 7 is a side view of a test socket of the burn-in test apparatus shown in FIGS. 4 to 6.
Figure 8:
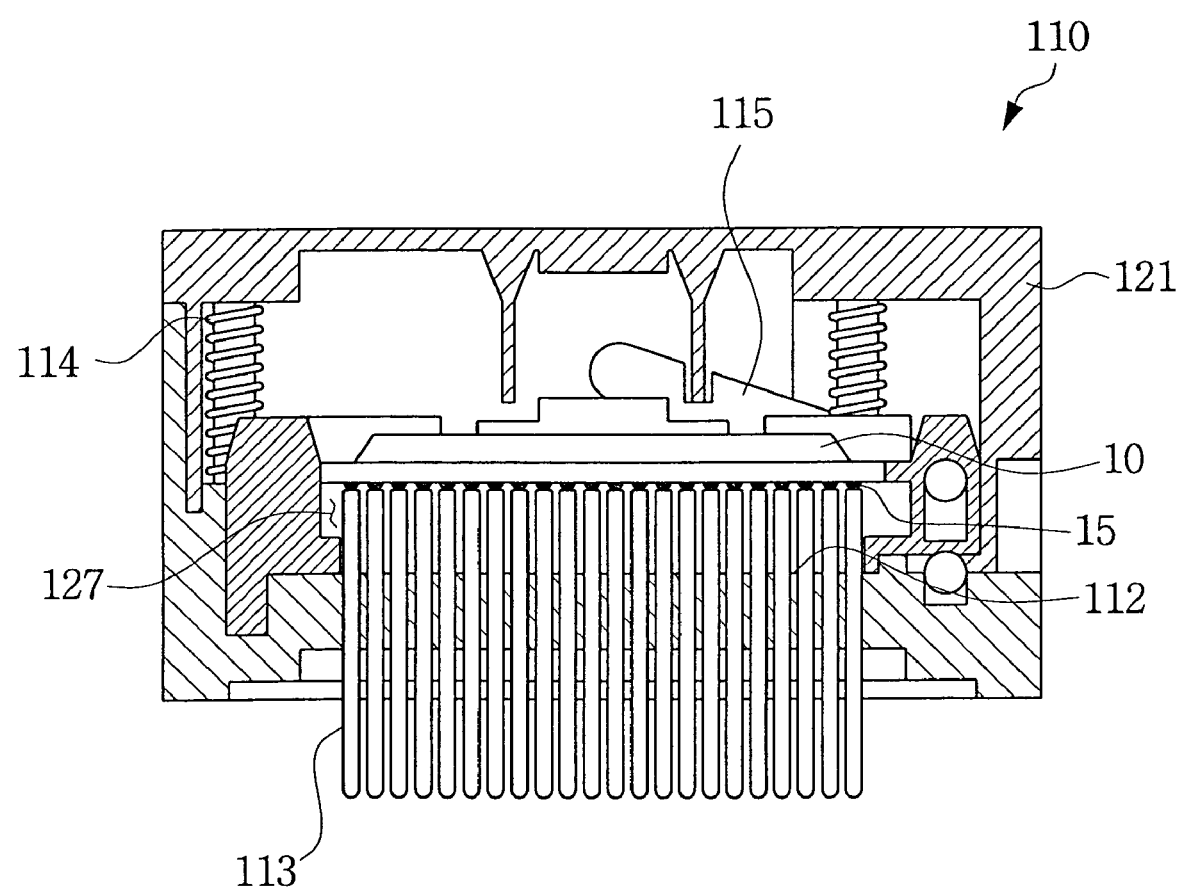
FIG. 8 is a cross-sectional view of the test socket shown in FIG. 7.

A detailed structure of the test socket 110 is depicted in FIGS. 7 and 8. FIG. 7 is a side view of the test socket 110, and FIG. 8 is a cross-sectional view. Referring to FIGS. 7 and 8, the test socket 110 includes a socket body 111 that has a central recess area for accommodating the BGA package 10. The test socket 110 further includes a plurality of contact pins 113 that penetrate the socket body 111 vertically and are configured to contact solder balls 15 that are placed on the bottom face of the BGA package 10. The contact pins 113 protrude from the inner top face 112 of the socket body 111, so a heat-escaping space 127 is provided around the solder balls 15. The protruding length of the contact pin 113 may be about 3 mm or more, preferably from 3 mm to 5 mm.

The test socket 110 has a holder 115 that presses down on the BGA package 10 so as to fixedly support the package 10, and a cover 121 that is positioned above the socket body 111 and presses down on the holder 115. The cover 121 is movably connected to the socket body 111 by springs 114. The cover 121 has a central opening 122 through which the BGA package 10 can enter and leave.

The test socket 110 has open sides facing each other so as to provide an opening for ventilation. The heat-escaping space 127 around the solder balls 15 communicates with the ventilation opening, so heat generated from the BGA package 10 is exposed to air ventilation. Each side of the socket body 111 has a female guide 116 recessed downward, and each side of the cover 121 has a complementary male guide 123a or 123b extending downward. One pair of male guides 123b faces each other. The other pair of male guides 123a that face each other has a recessed central part 124. Thus, both recessed central parts 124, together with the corresponding female guides 116, form the ventilation opening to which the heat-escaping space 127, the solder balls 15, and a neighboring area are exposed.

The recessed central part 124 may have a variety of geometric shapes. In an alternative embodiment, the ventilation opening may be formed in the socket body 111 only. In another alternative embodiment, the ventilation opening is formed in all of four sides. There are a great many possible configurations for the ventilation opening which satisfy the purpose of the present invention in addition that those specifically described herein. Any configuration is appropriate if it has an opening that allows air to pass through the inside of the test socket 110 so that air can blow from the first air supply duct 180 to the exhaust duct 210.

Figure 9:
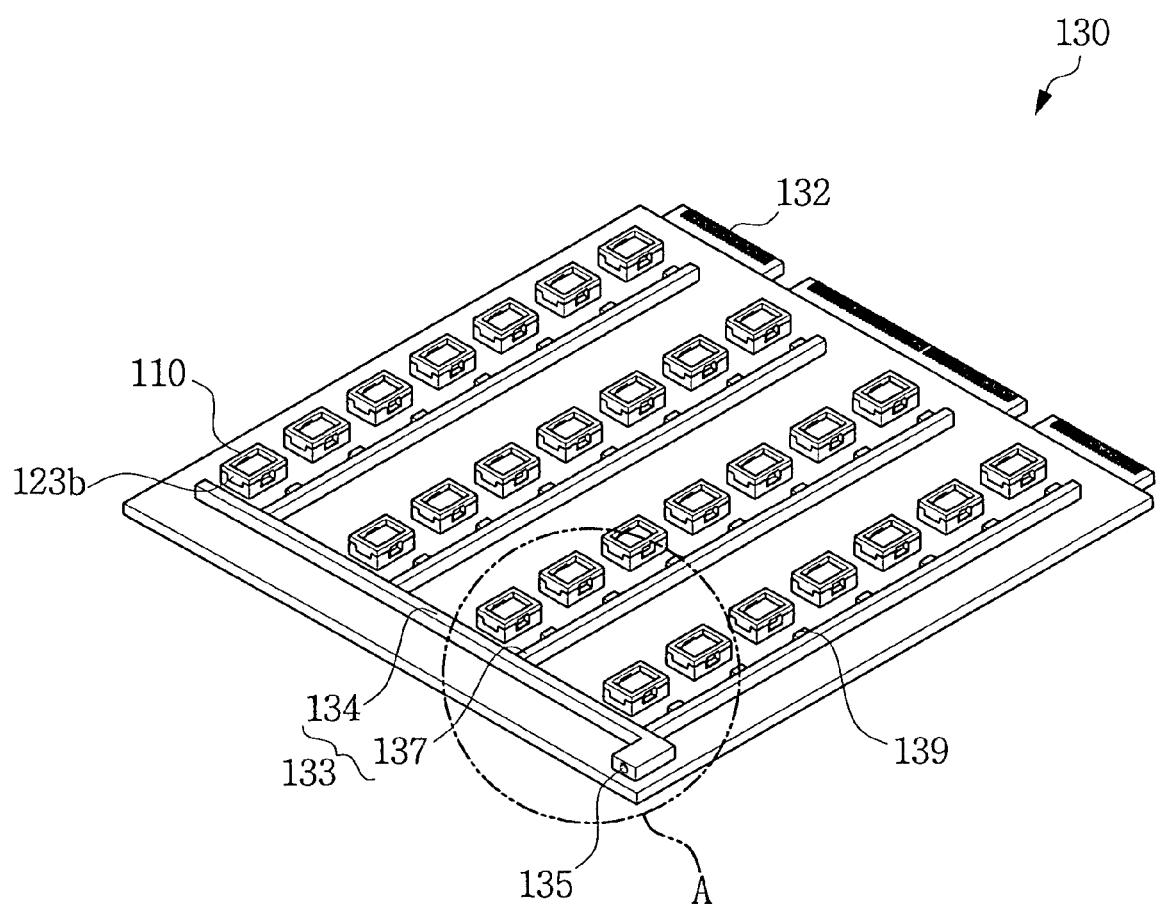
FIG. 9 is a perspective view of a burn-in board of the burn-in test apparatus shown in FIGS. 4 to 6.
Figure 10:
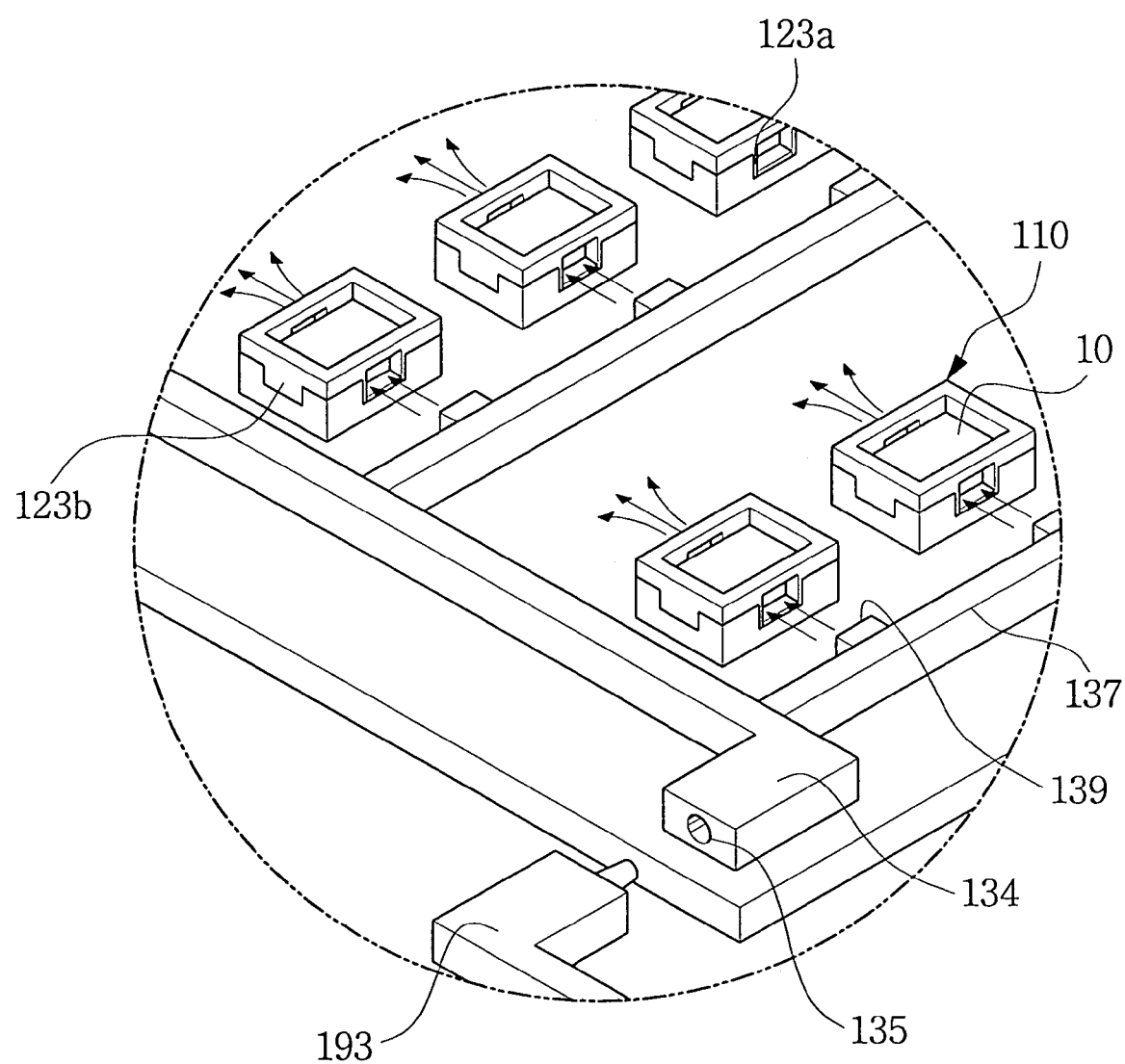
FIG. 10 is an enlarged view of a section "A" in FIG. 9.

A detailed structure of the burn-in board 130 is depicted in FIGS. 9 and 10. FIG. 9 is a perspective view of the burn-in board 130, and FIG. 10 is an enlarged view of a section "A" in FIG. 9. Referring to FIGS. 9 and 10, the burn-in board 130 has the test sockets 110 assembled thereon in several rows.

Suitable circuit patterns (not shown) are located on the burn-in board 130, and connectors 132 are located at one edge side of the burn-in board 130. The circuit patterns provide electrical path between the test sockets 110 and the connectors 132. Further, the connectors 132 are electrically coupled to a test system unit (not shown).

As shown in FIG. 9, the burn-in board 130 has air supply tubes 133 that blows air toward the test sockets 110. The air supply tubes 133 are composed of a main tube 134 and several branch tubes 137. The main tube 134 is disposed on the burn-in board 130 along one edge side opposite to the connectors 132. The main tube 134 has an air entrance 135 at one end. The branch tubes 137 diverge from the main tube 134 and then extend along the rows of the test sockets 110. Each branch tube 137 has several air nozzles 139, each of which faces the ventilation opening of a test socket 110. The air nozzles 139 blow air toward the test sockets 110 so that overheated air escapes from the test sockets 110.

Referring to FIGS. 4 to 6 again, the burn-in chamber 150 holds a large number of BGA packages 10 and provides an appropriate test environment. The burn-in chamber 150 has a temperature sensor 155 to measure an internal temperature of the chamber 150. The burn-in boards 130 are loaded in a rack 145, carrying the BGA packages 10. The burn-in chamber 150 may contain several racks 145. For example, it may contain four racks as illustrated. The rack 145 has guide rails 146 to allow easy loading/unloading of the burn-in boards 130 and to establish exact connections between the packages 10 and the test system unit (not shown). The rack 145 has open sides to allow good ventilation for the burn-in boards 130.

The heating unit 170 is positioned above the burn-in chamber 150 and it has a heater 171 to heat the air. A first air blower 173 blows heated air into the first air supply duct 180 and into the second air supply duct 190. The first and second air supply ducts 180 and 190 are positioned at one side of both the burn-in chamber 150 and the heating unit 170, and the exhaust duct 210 is positioned at the other side. The first and second air supply ducts 180 and 190 receive heated air from the heating unit 170 so as to maintain a uniform temperature within the burn-in chamber 150. Optionally the first air supply duct 180 may have a second air blower 191 (see FIG. 6) to blow heated air into to the second air supply duct 190. A first perforated plate 181 is formed at interface between the burn-in chamber 150 and the first air supply duct 180. The first perforated plate 181 has a plurality of holes 183 for controlling the air current.

Figure 11:
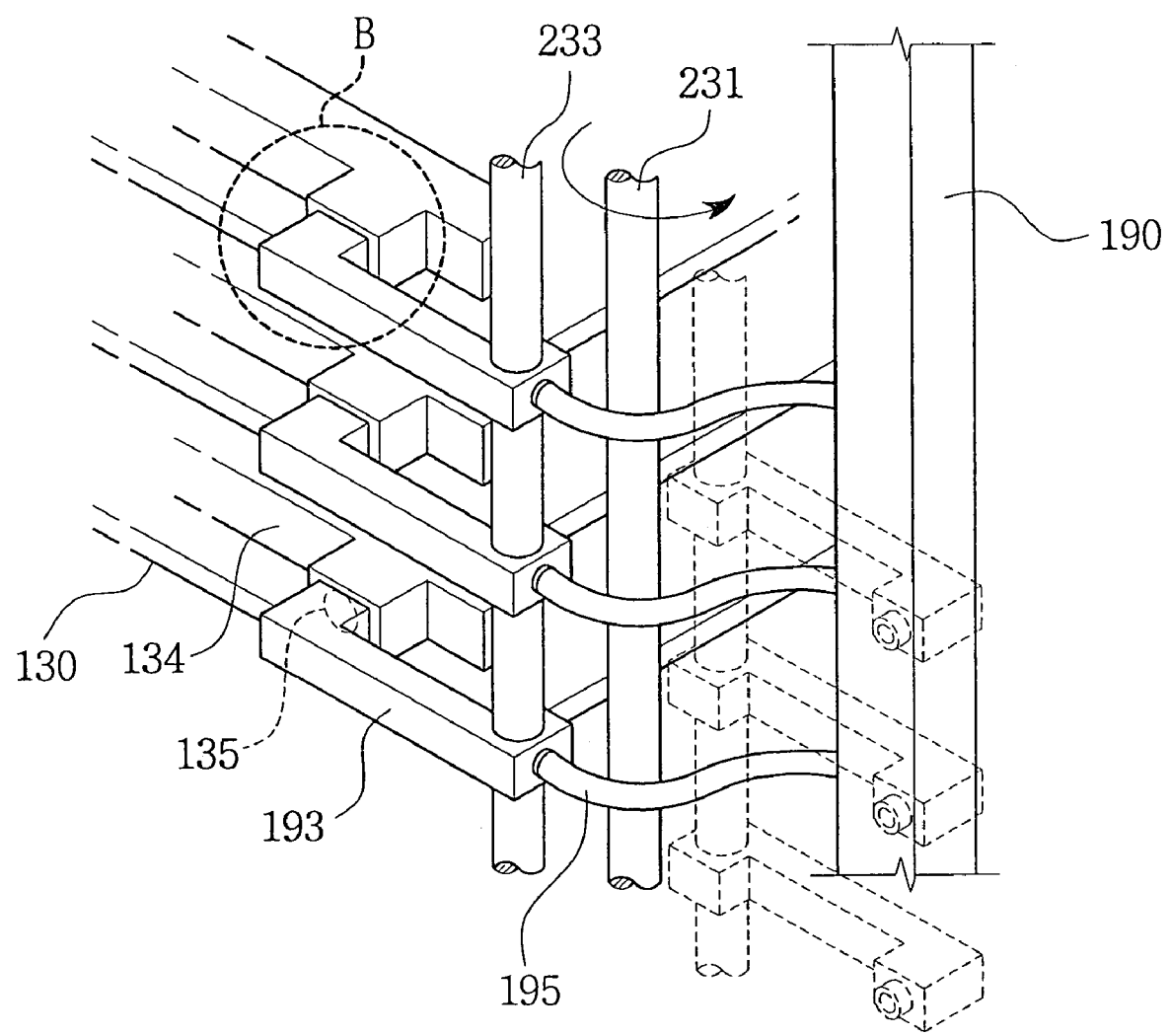
FIG. 11 is a perspective view showing the connection between a second air supply duct and the burn-in board shown in FIG. 9.
Figure 12:
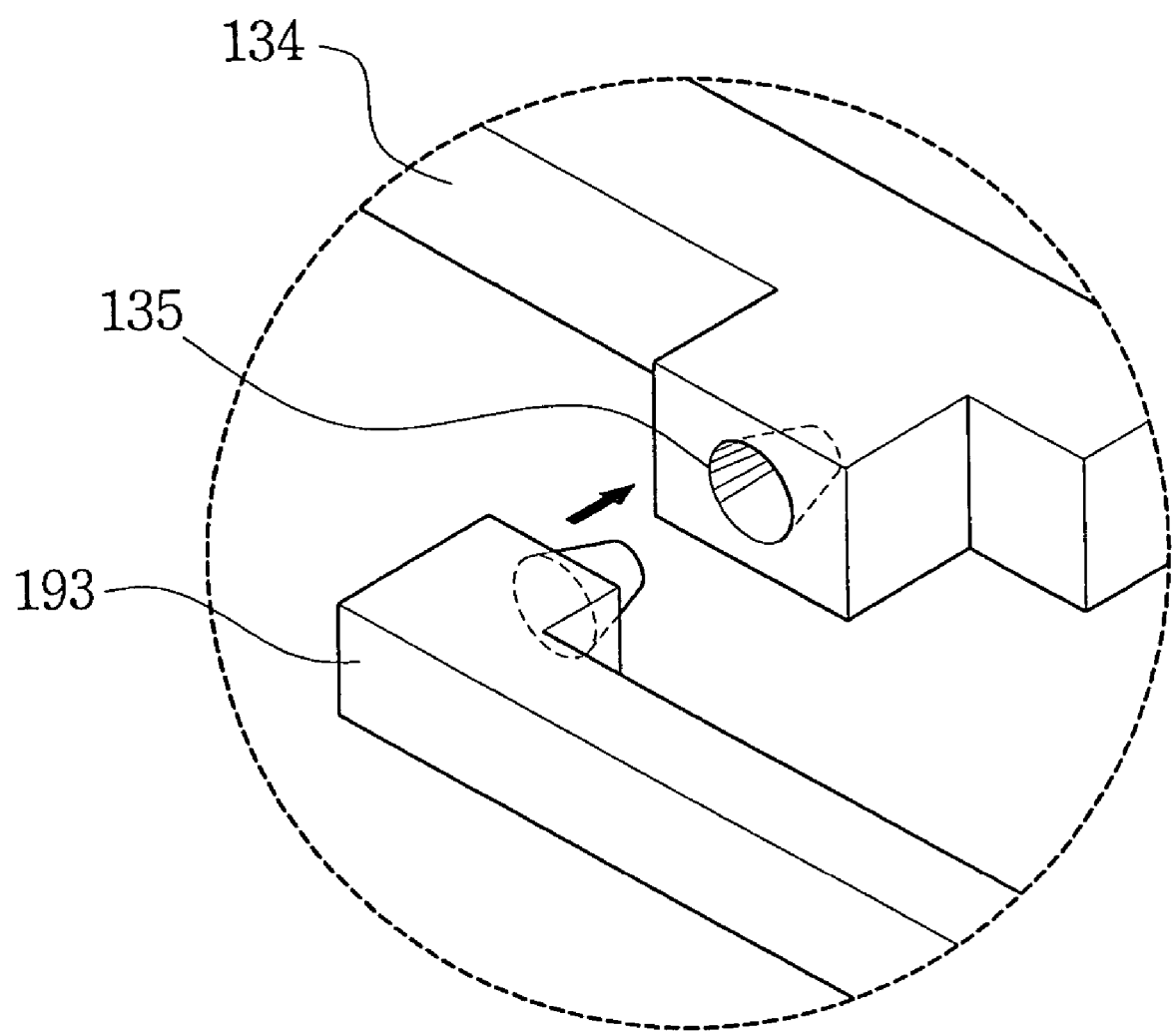
FIG. 12 is an enlarged view of a section "B" in FIG. 11.

The second air supply duct 190 is connected to the air supply tubes 133 of the burn-in boards 130. FIG. 11 is a perspective view showing the connection between the second air supply duct 190 and the burn-in board 130, and FIG. 12 is an enlarged view of a section "B" in FIG. 11. Further referring to FIGS. 11 and 12, the second air supply duct 190 is connected to the respective main tubes 134 of the air supply tubes 133 by couplers 193. Each coupler 193 is inserted at a first end into the air entrance 135 of the main tube 134, and joined at a second end to the second air supply duct 190, preferably via a flexible pipe 195. The couplers 193, extend horizontally and they are linked together at the second ends by a push bar 233 that extends vertically. The push bar 233 rotates on a pivot 231 that extends in parallel with the push bar 233. By the rotation of the push bar 233, the couplers 193 are joined to or disjoined from the main tubes 134 simultaneously. For easy joining or disjoining, the air entrance 135 of the main tube 134 and the first end of the coupler 193 may have complementary conic shapes. The flexible pipe 195 makes it possible to maintain a reliable connection between the coupler 193 and the second duct 190 when the couplers 193 rotate.

The exhaust duct 210 is a passage that permits the exhaustion of overheated air from the burn-in chamber 150 when an internal temperature of the chamber 150 exceeds a given value due to heat generated from the BGA packages 10 during tests. A second perforated plate 211 having holes 213 is formed at interface between the burn-in chamber 150 and the exhaust duct 210. The exhaust duct 210 may have any suitable exhaust fan (not shown).

At the beginning of the burn-in test, the heater 171 heats up air supplied from the outside. The air blower 173 supplies heated air into the first air supply duct 180. Heated air running in the first air supply duct 180 enters the burn-in chamber 150 through the first perforated plate 181, thus creating a required test environment of high temperature. Heated air is also supplied into the second air supply duct 190, and then sent to the main tubes 134 of the burn-in boards 130 through the couplers 193. Heated air arriving at the main tubes 134 is distributed to each of the branch tube 137 and emitted toward the test sockets 110 through the air nozzles 139. Emitted air passes through the inside of the test sockets 110 through the ventilation opening, and carries heat generated from the packages 10 to the outside. Therefore, there is very little temperature difference between the burn-in chamber 150, the test sockets 110, and the BGA packages 10.

As discussed above, the burn-in test apparatus according to the present invention is a forced heat exhaust type. In addition to a first air supply duct for the burn-in chamber, a second air supply duct and air supply tubes are added in the apparatus to provide another flow of air into the test sockets containing the BGA packages. Further, the test sockets have a modified structure suitable for ventilation of air. Accordingly, the apparatus of the present invention can control the temperature around the BGA packages as well as the temperature in the burn-in chamber, thus preventing a ball-melting problem.

It is noted that the contact pins may have a protruding portion that is from about 3 mm to about 5 mm long.

It is also noted that the air supply tube may have a main tube disposed on the burn-in board, branch tubes diverging from the main tube, and air nozzles formed in the branch tubes to blow air toward the test sockets. Preferably, each of the air nozzles faces a ventilation opening formed in the test socket. The second air supply duct may be connected to the main tubes by couplers. Each of the couplers may be inserted at a first end into an air entrance formed in the main tube and be joined at a second end to the second air supply duct via a flexible pipe. The couplers may be linked together at the second ends to a push bar that rotates on a pivot so as to join or disjoin the couplers to or from the main tubes. The air entrance of the main tube and the first end of the coupler may have complementary conic shapes. The first air supply duct may have a second air blower that sends heated air to the second air supply duct.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A burn-in test apparatus comprising:
   a burn-in chamber in which a test environment is maintained;
   a plurality of burn-in boards located in the burn-in chamber;
   a plurality of test sockets on each of the burn-in boards, each of the test sockets accommodating a package having conductive balls on the underside thereof, the test sockets having openings which allow air ventilation of the conductive balls;
air supply tubes for directing air toward the test sockets;
a heating unit that applies heat to air;
a first air supply duct that provides heated air from the heating unit to the burn-in chamber;
a second air supply duct that provides heated air from the heating unit to the air supply tubes; and
an exhaust duct that exhausts heated air from the burn-in chamber.

2. The burn-in apparatus of claim 1, wherein each of the test sockets includes:
a socket body that has a central recess area for accommodating the BGA package;
a plurality of contact pins that protrude from the socket body and are configured to contact with the conductive balls of the BGA package;
a holder that presses down the package so as to fixedly support the package; and
a cover positioned above the socket body and movably connected to the socket body to press down the holder, and having a central opening through which the BGA package enters and leaves.

3. The burn-in apparatus of claim 2, wherein each of the test sockets further includes open sides so as to provide air ventilation opening.

4. The burn-in apparatus of claim 2, wherein each side of the socket body has a female guide recessed downward, and each side of the cover has a complementary male guide extending downward.

5. The burn-in apparatus of claim 4, wherein at least one pair of the male guides has a recessed central part forming a ventilation opening.

6. The burn-in apparatus of claim 2, wherein a protruding length of the contact pin is from about 3 mm to about 5 mm.

7. The burn-in apparatus of claim 1, wherein the heating unit has a heater that heats air and a first air blower blowing heated air into the first air supply duct and the second air supply duct.

8. The burn-in apparatus of claim 1, wherein the air supply tube has a main tube branch tubes diverging from the main tube, and air nozzles formed in the branch tubes to blow air toward the test sockets.

9. The burn-in apparatus of claim 8, wherein each of the air nozzles faces a ventilation opening formed in the test socket.

10. The burn-in apparatus of claim 8, wherein the second air supply duct is connected to the main tubes by couplers.

11. The burn-in apparatus of claim 10, wherein each of the couplers is inserted at a first end into an air entrance formed in the main tube and is joined at a second end to the second air supply duct via a flexible pipe.

12. The burn-in apparatus of claim 11, wherein the couplers are linked together at the second ends by a push bar that rotates on a pivot so as to join or disjoin the couplers to or from the main tubes.

13. The burn-in apparatus of claim 11, wherein the air entrance of the main tube and the first end of the coupler have complementary conic shapes.

14. The burn-in apparatus of claim 1, wherein the first air supply duct has a second air blower that sends heated air to the second air supply duct.

15. A burn-in test apparatus for Ball Grid Array (BGA) packages which have conductive ball connectors, the burn-in test apparatus comprising:
a plurality of burn-in boards located in a burn in chamber;
a plurality of test sockets for holding BGA packages on each of the burn-in boards, the test sockets having openings which allow air ventilation of the conductive balls;
air supply tubes for directing air toward the test sockets;
a first air supply duct that provides heated air to the burn-in chamber;
a second air supply duct that provides heated air to the air supply tubes; and
an exhaust duct that exhausts heated air from the burn-in chamber.

16. The burn in test apparatus recited in claim 15 wherein the test sockets have a base and contact pins that pass through the base and protrude above the base to contact the conductive balls, whereby the conductive balls can be ventilated during test.

* * * * *